United States Patent
Huang et al.

(10) Patent No.: US 9,748,445 B2
(45) Date of Patent: Aug. 29, 2017

(54) LIGHT EMITTING DIODE (LED) DIE MODULE, LED ELEMENT WITH THE LED DIE MODULE AND METHOD OF MANUFACTURING THE LED DIE MODULE

(71) Applicant: ADVANCED OPTOELECTRONIC TECHNOLOGY, INC., Hsinchu Hsien (TW)

(72) Inventors: Chien-Shiang Huang, Hsinchu (TW); Tzu-Chien Hung, Hsinchu (TW); Po-Min Tu, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/809,422

(22) Filed: Jul. 27, 2015

(65) Prior Publication Data
US 2016/0087176 A1    Mar. 24, 2016

(30) Foreign Application Priority Data
Sep. 19, 2014    (CN) .......................... 2014 1 0480623

(51) Int. Cl.
*H01L 33/00* (2010.01)
*H01L 33/44* (2010.01)
*H01L 33/38* (2010.01)

(52) U.S. Cl.
CPC .............. *H01L 33/44* (2013.01); *H01L 33/38* (2013.01); *H01L 2933/0016* (2013.01); *H01L 2933/0025* (2013.01)

(58) Field of Classification Search
CPC ...... H01L 33/44; H01L 33/38; H01L 2933/00
USPC ..................................................... 257/98–100
See application file for complete search history.

(56) References Cited

U.S. PATENT DOCUMENTS

| 7,369,583 B2 * | 5/2008 | Ledentsov | H01S 5/0607 372/102 |
| 2002/0030442 A1 * | 3/2002 | Koyama | H01L 51/5262 313/504 |
| 2005/0035354 A1 * | 2/2005 | Lin | H01L 33/42 257/79 |
| 2005/0218422 A1 * | 10/2005 | Tojo | H01S 5/4031 257/103 |

(Continued)

FOREIGN PATENT DOCUMENTS

| CN | 202549921 U | 11/2012 |
| TW | 201351653 A | 12/2013 |

*Primary Examiner* — Yuanda Zhang
*Assistant Examiner* — Sheikh Maruf
(74) *Attorney, Agent, or Firm* — Steven Reiss (57) ABSTRACT

A light emitting diode (LED) die module includes an LED die and a guiding layer formed on the LED die. The guiding layer includes a first portion, a second portion and a third portion. The first portion and the second portion are positioned at two edges of the surface of the LED die opposite to each other. The third portion is connected between the first portion and the second portion and divides the surface into a first electrically connecting area and a second electrically connecting area. The first portion, the second portion and the third portion defines a first opening and a second opening. The first opening and the second opening face two opposite directions. The present disclose also provides an LED element with the LED die module and a method of manufacturing the LED die module.

17 Claims, 10 Drawing Sheets

(56) References Cited

U.S. PATENT DOCUMENTS

| | | | | |
|---|---|---|---|---|
| 2007/0177644 A1* | 8/2007 | Corzine | ................. | H01L 33/20 |
| | | | | 372/44.01 |
| 2007/0296089 A1* | 12/2007 | Thomas | ................. | C09J 163/00 |
| | | | | 257/783 |
| 2008/0080809 A1* | 4/2008 | Kushiyama | .............. | G02B 6/43 |
| | | | | 385/14 |
| 2009/0095973 A1* | 4/2009 | Tanaka | ................... | B82Y 20/00 |
| | | | | 257/99 |
| 2010/0215314 A1* | 8/2010 | Lau | ......................... | G02B 6/43 |
| | | | | 385/14 |
| 2011/0042706 A1* | 2/2011 | Tanaka | ................... | C30B 19/00 |
| | | | | 257/98 |
| 2012/0037935 A1* | 2/2012 | Yang | ................. | H01L 31/0203 |
| | | | | 257/98 |
| 2013/0328131 A1* | 12/2013 | Lu | ........................... | H01L 28/24 |
| | | | | 257/379 |
| 2014/0138727 A1* | 5/2014 | Chang | ................... | H01L 21/78 |
| | | | | 257/98 |

\* cited by examiner

LIGHT EMITTING DIODE (LED) DIE MODULE, LED ELEMENT WITH THE LED DIE MODULE AND METHOD OF MANUFACTURING THE LED DIE MODULE

CROSS-REFERENCE TO RELATED APPLICATIONS

This application claims priority to Chinese Patent Application No. 201410480623.3 filed on Sep. 19, 2014, the contents of which are incorporated by reference herein.

FIELD

The disclosure relates to a light emitting diode (LED) die module, an LED element with the LED die module and a method of manufacturing the LED die module.

BACKGROUND

An LED die with electrodes typically is electrically connected to a board with circuit structure by a die attaching material. A usage of the die attaching material affects the electric connectivity between the LED die and the circuit structure of the board.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. The description is not to be considered as limiting the scope of the embodiments described herein.

Figure 1:
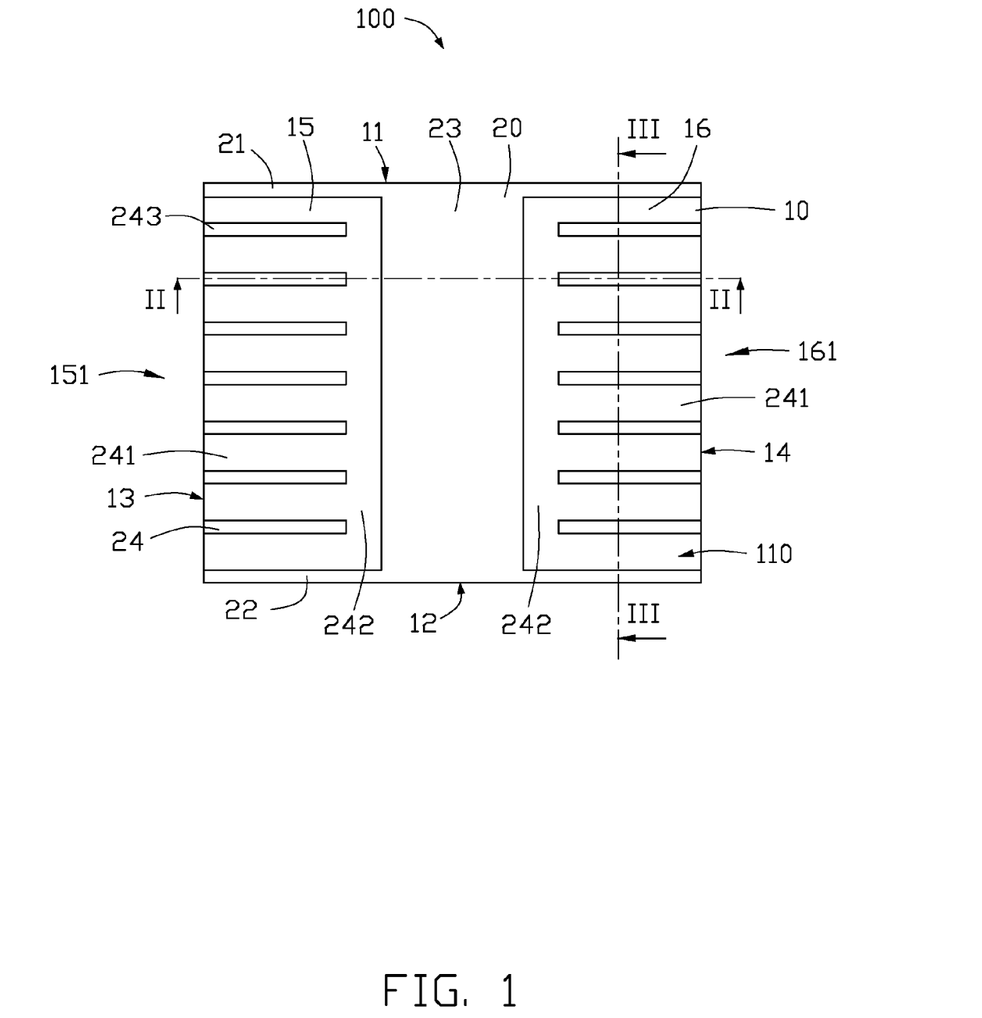
FIG. 1 is a top plan view showing an LED die module in accordance with a first embodiment of the present disclosure.
Figure 2:
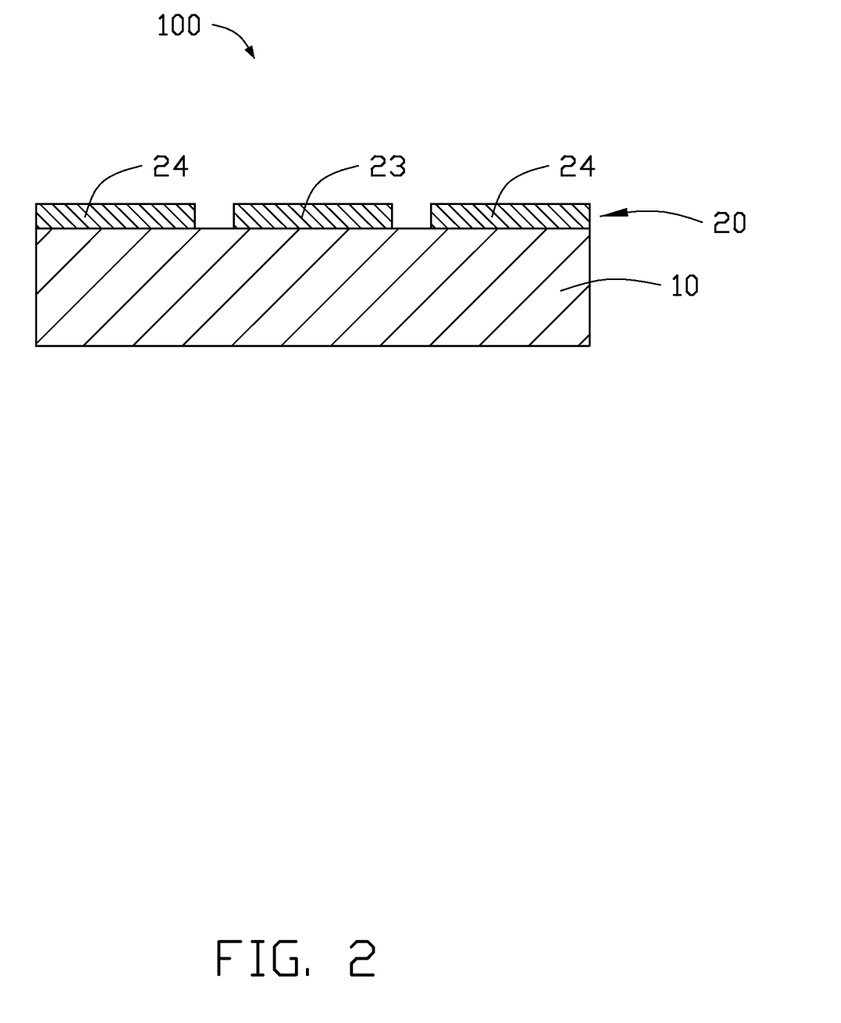
FIG. 2 is a cross sectional view showing the LED die module of FIG. 1, taken along line II-II thereof.
Figure 3:
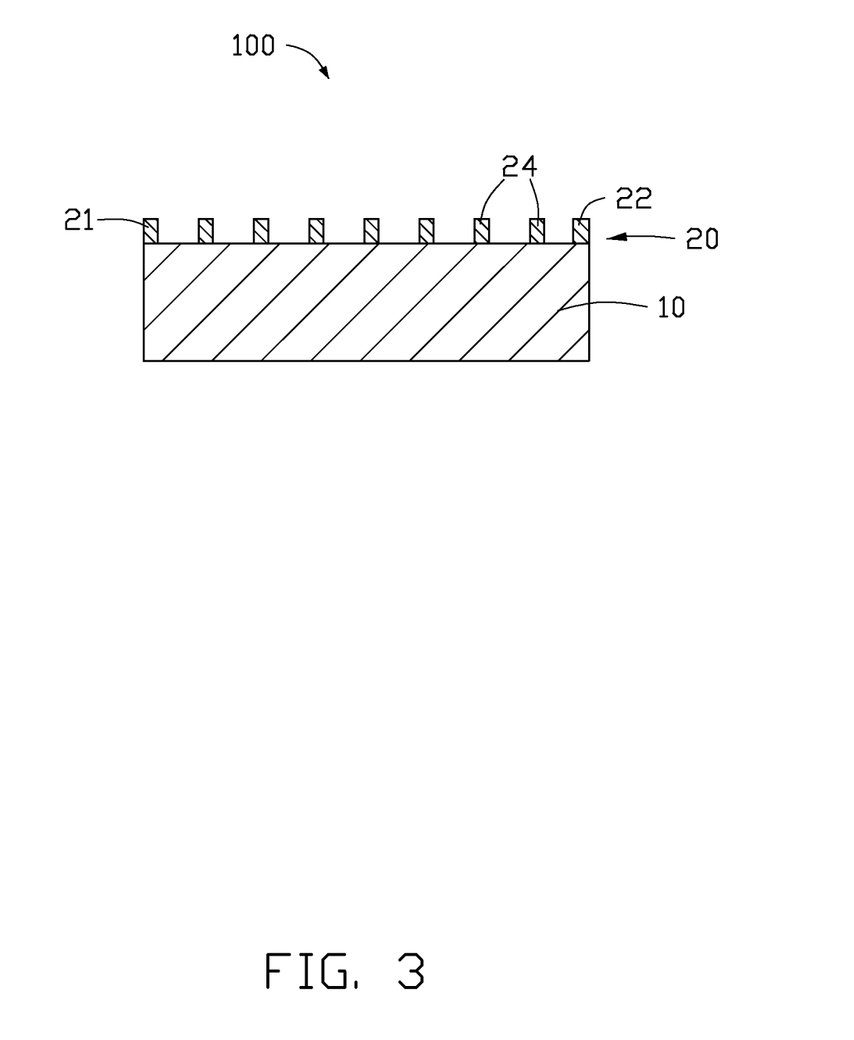
FIG. 3 is a cross sectional view showing the LED die module of FIG. 1, taken along line III-III thereof.

Referring to FIGS. 1-3, an LED die module 100, the LED die module 100 includes an LED die 10 and a guiding layer 20 formed on the LED die 10.

The LED die 10 includes an N-type semiconductor layer, an active layer and a P-type semiconductor layer (not shown). The LED die 10 can further include other structures (not shown), such as an insulating structure, the insulating structure can include a plurality of through holes. The through holes can be configured to be filled by an electrically connecting material, and the electrically connecting material of through holes can respectively electrically connect the N-type semiconductor layer and the P-type semiconductor layer of the LED die 10 to a circuit structure (not shown). The insulating structure avoids a short circuit created between the N-type semiconductor layer and the P-type semiconductor layer. The electrically connecting material can be made of nickel, silver, platinum, chromium, gold or other alloy materials.

The LED die 10 has a surface 110. In at least this embodiment, the surface 110 can be rectangular. The surface 110 includes a first edge 11, a second edge 12, a third edge 13 and a fourth edge 14. The first edge 11 is opposite to the second edge 12, and the third edge 13 is opposite to the fourth edge 14.

The guiding layer 20 is formed on the surface 110 of the LED die 10. The guiding layer 20 includes a first portion 21, a second portion 22 and a third portion 23. The first portion 21 and the second portion 22 are positioned at two edges of the surface 110 of the LED die 10 opposite to each other. In at least one embodiment, the first portion 21 is formed on the first edge 11 of the surface 110, and the second portion 22 is formed on the second edge 12 of the surface 110. The first portion 21 and the second portion 22 are stick-shaped. Both the first portion 21 and the second portion 22 extend from the third edge 13 to the fourth edge 14. In this embodiment, the first portion 21 is parallel to the second portion 22. The third portion 23 is stick-shaped. The third portion 23 is connected between the first portion 21 and the second portion 22. In at least one embodiment, the third portion 23 is perpendicular to the first portion 21 and the second portion 22. The first portion 21, the second portion 22 and the third portion 23 form an H-shaped structure.

The third portion 23 divides the surface 110 into a first electrically connecting area 15 and a second electrically connecting area 16. The first portion 21, the second portion 22 and the third portion 23 defines a first opening 151 positioned at the first electrically connecting area 15 and a second opening 161 positioned at the second electrically connecting area 16. The first opening 151 and the second opening 161 face two opposite directions. In at least one embodiment, the first opening 151 faces the third edge 13 of the surface 110, and the second opening 161 faces the fourth edge 14 of the surface 110. The first electrically connecting area 15 and the second electrically connecting area 16 are respectively electrically connected to an n-type semiconductor layer and a p-type semiconductor layer of the LED die 10 (not shown). The first portion 21, the second portion 22 and the third portion 23 limit a region in the surface 110 of the LED die 10 configured for receiving a die attaching material (not shown). The die attaching material is received in the first electrically connecting area 15 and the second electrically connecting area 16, and the excess die attaching material can be drained off from the first opening 151 and the second opening 161.

The guiding layer 20 further includes a plurality of fourth portions 24. The fourth portions 24 are formed on the first electrically connecting area 15 and the second electrically connecting area 16 of the surface 110. The fourth portions 24 are formed spaced from each other. A first region 241 is defined between the fourth portions 24. The first region 241 is as a channel configured for draining off the excess die attaching material. The fourth portions 24 are spaced from the first portion 21, the second portion 22 and the third portion 23. A second region 242 is defined between the fourth portions 24 and the first portion 21, the second portion 22 and the third portion 23. The second region 242 is a receiving space for receiving the die attaching material. The first electrically connecting area 15 and the second electrically connecting area 16 are exposed at the first region 241 and the second region 242.

Four embodiments of the LED die 10 with the fourth portions 24 are following:

In a first embodiment (referring to FIG. 1), the fourth portions 24 can be stick-shaped. The fourth portions 24 can include a plurality of stick-shaped strips 243 formed on the first electrically connecting area 15 and the second electrically connecting area 16. A length of each strip 243 can be same. A width of the each strip 243 can be same. The strips 243 positioned at the first electrically connecting area 15 extend from the third edge 13 of the surface 110 toward the third portion 23, and be spaced from the third portion 23. The strips 243 positioned at the second electrically connecting area 16 extend from the fourth edge 14 of the surface 110 toward the third portion 23, and be spaced from the third portion 23.

Figure 4:
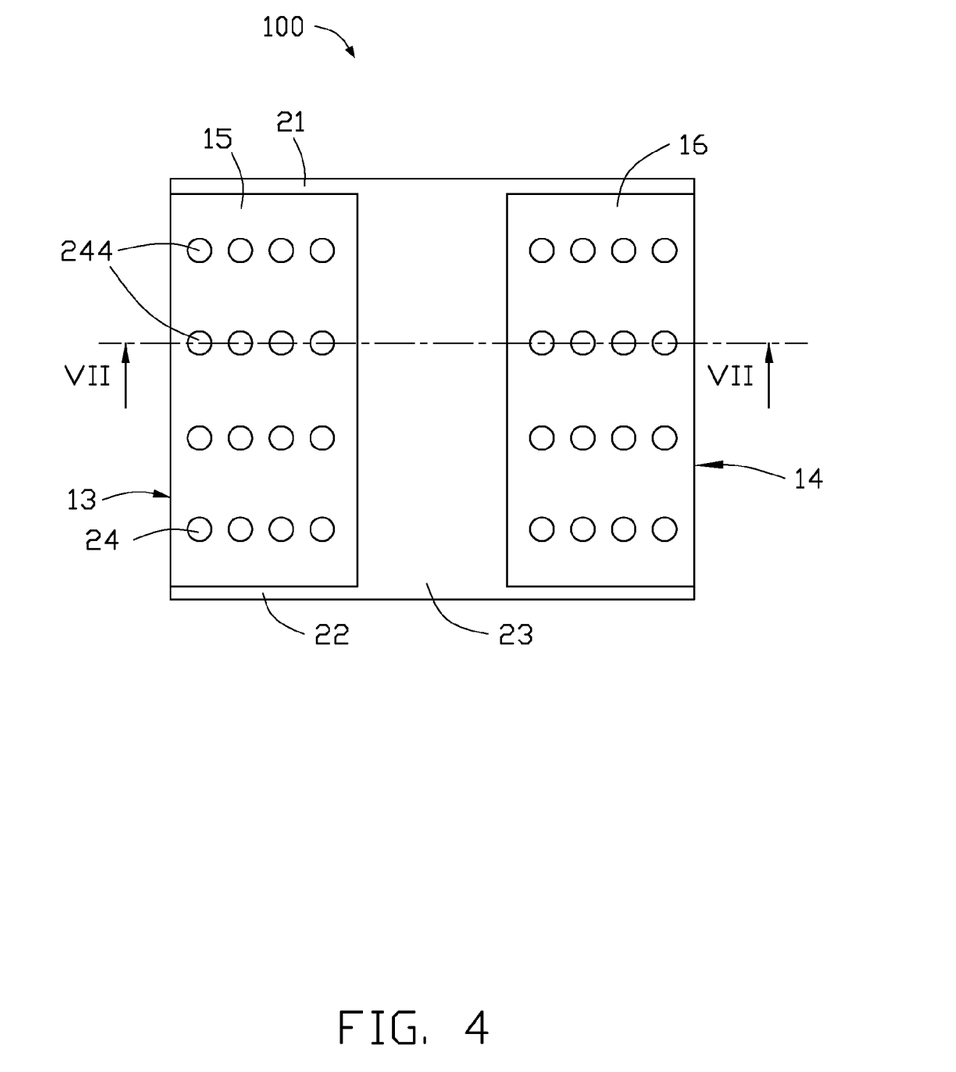
FIG. 4 is a top plan view showing an LED die module in accordance with a second embodiment of the present disclosure.

In a second embodiment (referring to FIG. 4), the fourth portions 24 can be cylindrically shaped. The fourth portions 24 can include a plurality of pillars 244. The pillars 244 can be cylindrical and arranged in a matrix. A top view of each pillar 244 can be circular, and each have a same diameter. The pillars 244 can be evenly distributed at the first electrically connecting area 15 and the second electrically connecting area 16.

Figure 5:
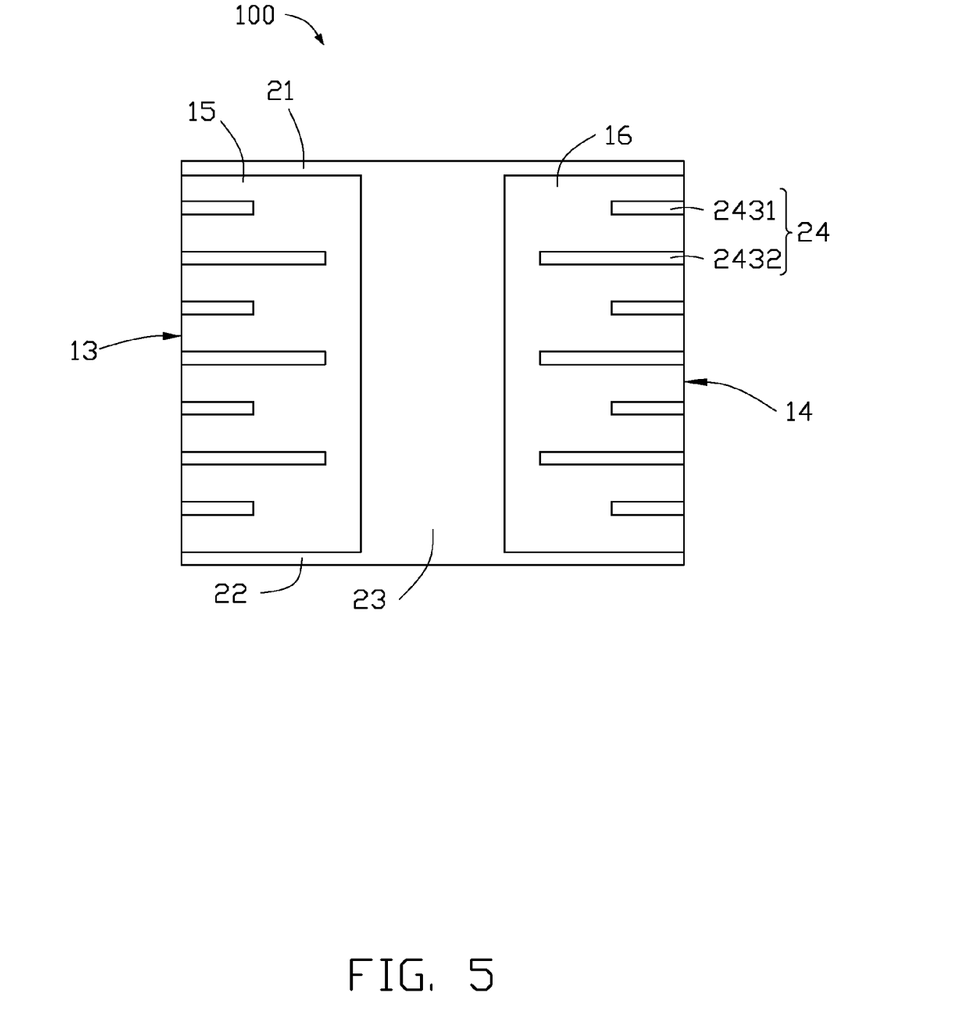
FIG. 5 is a top plan view showing an LED die module in accordance with a third embodiment of the present disclosure.

In a third embodiment (referring to FIG. 5), the fourth portions 24 can be stick-shaped. A top view of the fourth portion 24 can be rectangular. The fourth portions 24 can include a plurality of first sticks 2431 and a plurality of second sticks 2432. A length of each first stick 2431 can be less than or equal to that of each second stick 2432. A width of each first stick 2431 can be the same as that of each second stick 2432. The first sticks 2431 and the second sticks 2432 can be parallel to each other. The second sticks 2432 can alternate with the first sticks 2431. The first sticks 2431 extend from the third edge 13 of the surface 110 to the third portion 23, and can be spaced from the third portion 23. The second sticks 2432 extend from the fourth edge 14 of the surface 110 to the third portion 23, and can be spaced from the third portion 23.

Figure 6:
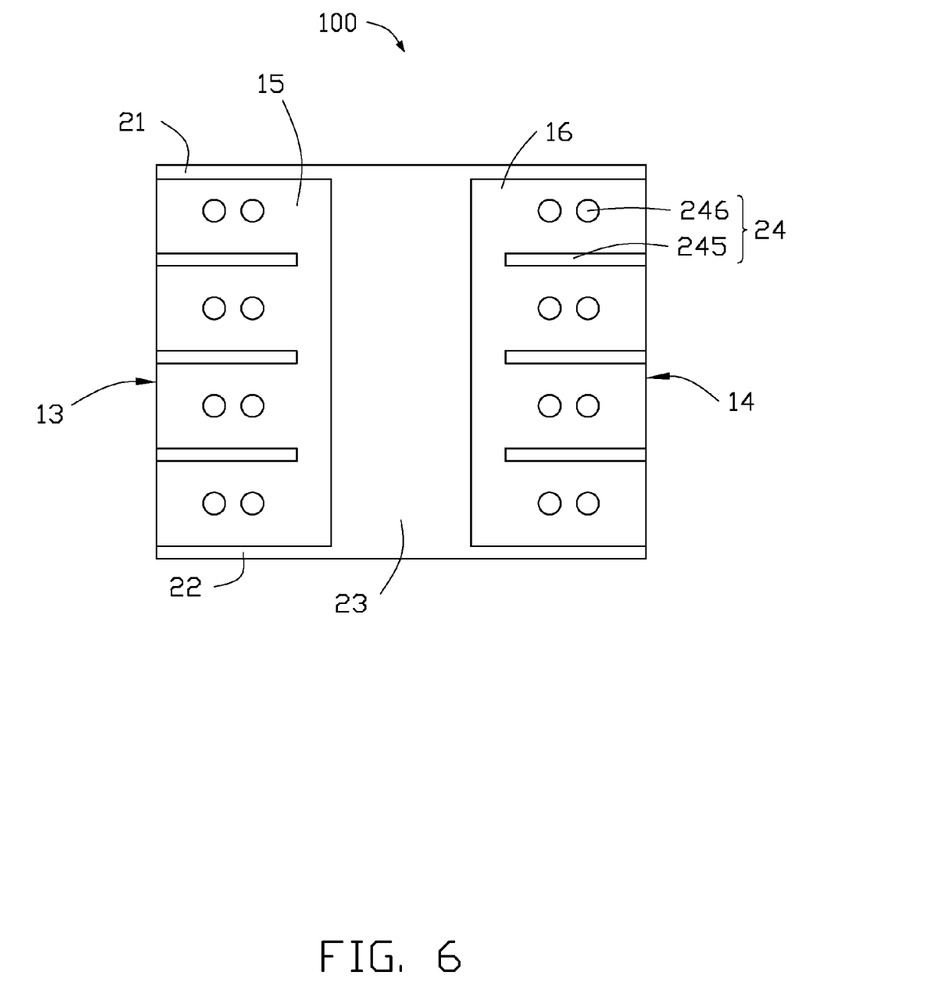
FIG. 6 is a top plan view showing an LED die module in accordance with a fourth embodiment of the present disclosure.

In a fourth embodiment (referring to FIG. 6), the fourth portions 24 can include a plurality of stick-shaped portions 245 and a plurality of circular portions 246. A length of each stick-shaped portion 24 can be same. A width of each stick-shaped portion 245 can be same. The stick-shaped portions 245 positioned at the first electrically connecting area 15 extend from the third edge 13 of the surface 110 to the third portion 23, and are spaced from the third portion 23. The stick-shaped portions 245 positioned at the second electrically connecting area 16 extend from the fourth edge 14 of the surface 110 to the third portion 23, and are spaced from the third portion 23. The circular portions 246 can be arranged in a matrix, which has four rows, in each row, there are four circular portions. The stick-shaped portions 245 can cross between the circular portions 246.

It is understood that the LED die 10 with the fourth portions 24 is not limited to the above embodiments. For example, the fourth portions 24 can be elliptic, triangle or other shaped cylinder.

A thickness of the fourth portions 24 can be less than or equal to the first portion 21, the second portion 22 and the third portion 23. In the illustrated embodiment, the thickness of the fourth portions 24 is equal to the first portion 21, the second portion 22 and the third portion 23.

The guiding layer 20 is made of insulating material. The guiding layer 20 can be made of ceramic, $SiO_2$, $Si_xN_y$, $Al_2O_3$, $Al_2N_3$, diamond like carbon, siloxane, fluorine carbon doped compounds or carbon oxide. A thickness of the guiding layer 20 can be less than or equal to 2 micrometers.

Figure 7:
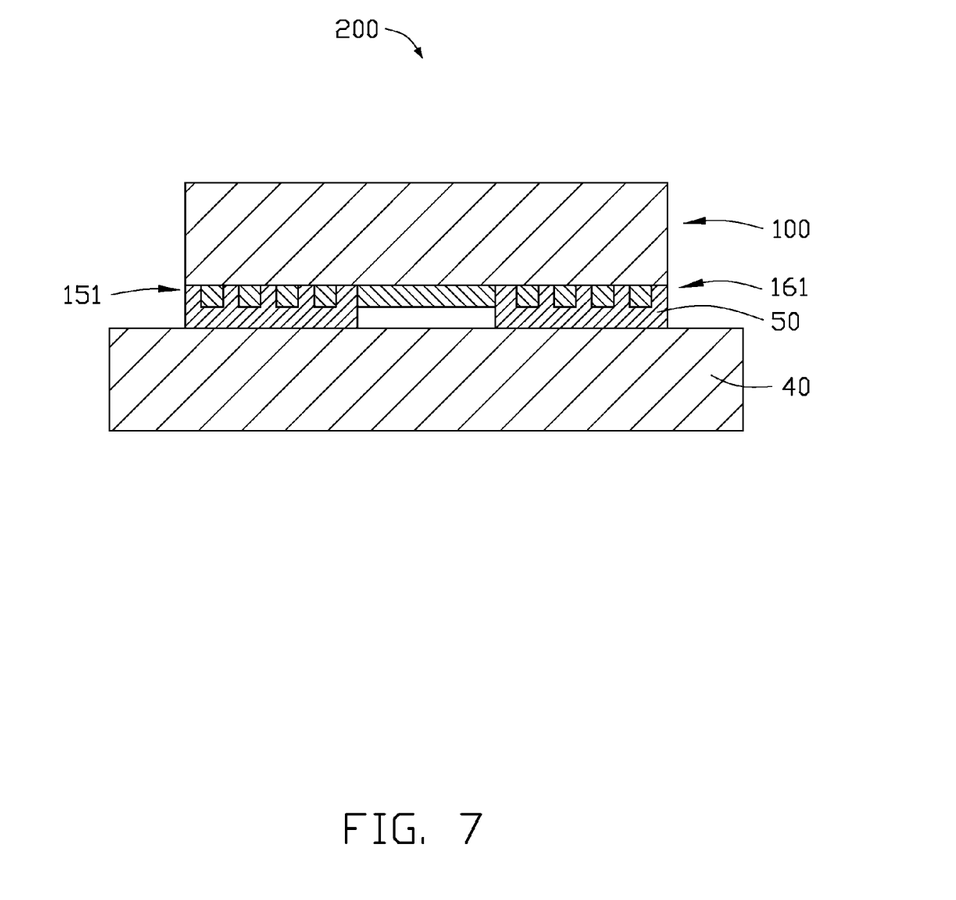
FIG. 7 is a cross sectional view showing an LED element with the LED die module of FIG. 4, taken along line VII-VII thereof.

As illustrated in FIG. 7, the present disclose also provides an LED element 200. The LED element 200 includes the LED die module 100 and a substrate 40. The substrate 40 includes a circuit structure (not shown). The LED die module 100 is formed on the substrate 40 and electrically connected to the substrate 40 by a die attaching layer 50. A thickness of the die attaching layer 50 is larger than or equal to 5 micrometers. A thickness of the substrate 40 is equal to or greater than fifty (50) micrometers.

Figure 8:
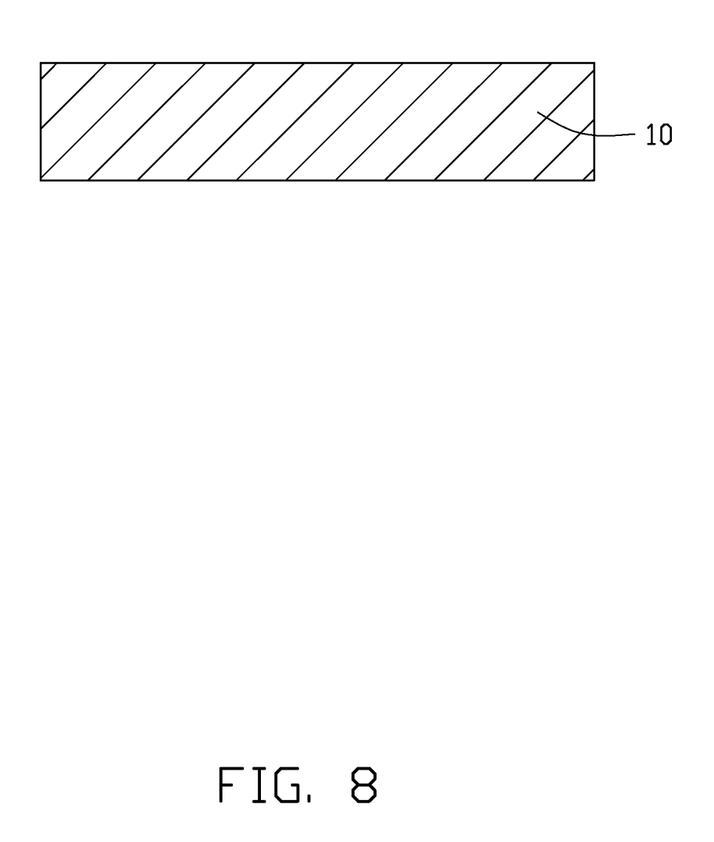
FIG. 8 is a cross sectional view showing a semi-finished LED die module processed by "providing an LED die" of a method of manufacturing an LED die module in accordance with an embodiment of the present disclosure.
Figure 9:
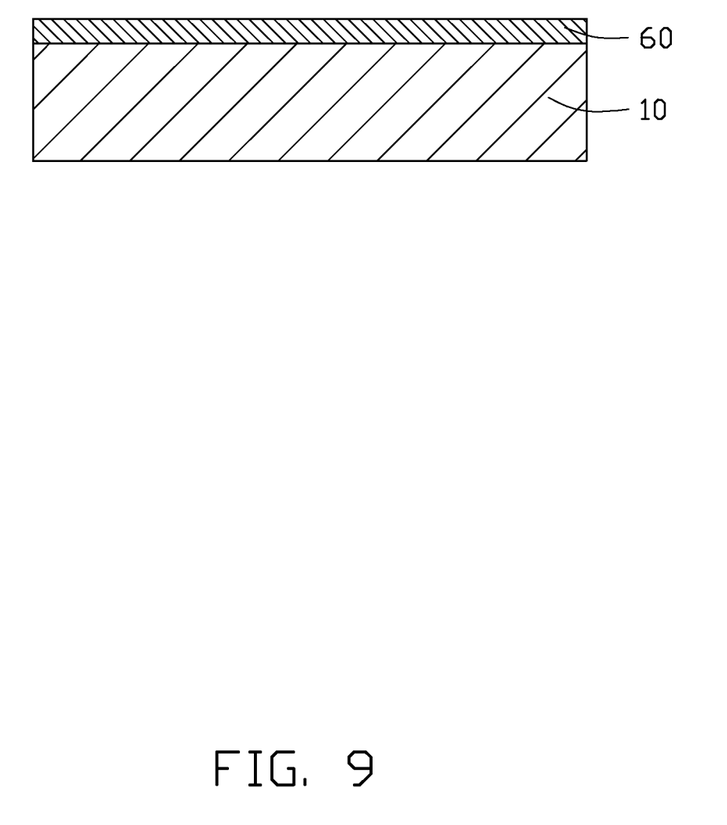
FIG. 9 is a cross sectional view showing a semi-finished LED die module processed by "forming a preprocessing layer on a surface of the LED die" of a method of manufacturing an LED die module in accordance with an embodiment of the present disclosure.
Figure 10:
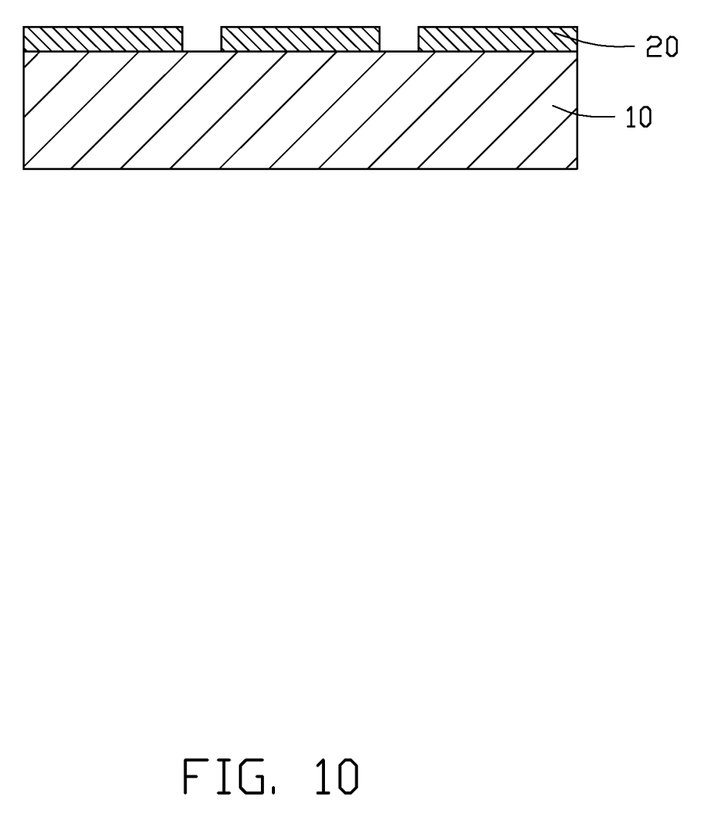
FIG. 10 is a cross sectional view showing a semi-finished LED die module processed by "etching the preprocessing layer to define a guiding layer" of a method of manufacturing an LED die module in accordance with an embodiment of the present disclosure.

The present disclose also provides a method of manufacturing the LED die module 100. The method includes:
providing an LED die 10, as illustrated in FIG. 8;
forming a preprocessing layer 60 on a surface 110 of the LED die 10, as illustrated in FIG. 9; and
etching the preprocessing layer 60 to define a guiding layer 20, as illustrated in FIG. 10.

The LED die 10 includes an N-type semiconductor layer, an active layer and a P-type semiconductor layer (not shown). The LED die 10 can further include other structures (not shown), such as an insulating structure, the insulating structure can include a plurality of through holes. The through holes can be configured to be filled by an electrically connecting material, and the electrically connecting material of through holes can respectively electrically connect the N-type semiconductor layer and the P-type semiconductor layer of the LED die 10 to a circuit structure (not shown). The insulating structure avoids a short circuit created between the N-type semiconductor layer and the P-type semiconductor layer.

The preprocessing layer 60 is made of insulating material. The guiding layer 20 can be made of ceramic, $SiO_2$, $Si_xN_y$, $Al_2O_3$, $Al_2N_3$, diamond like carbon, siloxane, fluorine carbon doped compounds or carbon oxide.

The guiding layer 20 divides the surface 110 of the LED die 10 into a first electrically connecting area 15 and a second electrically connecting area 16. The first electrically connecting area 15 and the second electrically connecting area 16 are respectively electrically connected to an n-type semiconductor layer and a p-type semiconductor layer of the LED die 10 (not shown). A thickness of the guiding layer 20 is less than or equal to 2 micrometers.

The embodiments shown and described above are only examples. Many details are often found in the art such as the other features of an LED die module, an LED element with the LED die module and a method of manufacturing the LED die module. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) die module comprising:
an LED die having a surface with a first edge, a second edge, a third edge, and a fourth edge, the first edge being opposite to the second edge, and the third edge being opposite to the fourth edge; and
a guiding layer formed on the surface, comprising:
a first portion formed on the first edge of the surface;
a second portion formed on the second edge of the surface;
a third portion connected between the first portion and the second portion, and dividing the surface into a first electrically connecting area and a second electrically connecting area; and
a first opening positioned at the first electrically connecting area and a second opening positioned at the second electrically connecting area facing two opposite directions and defined by the first portion, the second portion and the third portion, the first opening being a gap between the first portion and the second portion, the first opening being opened to the surface of the LED die and opened to the third edge, the second opening being a gap between the first portion and the second portion, the second opening being opened to the surface of the LED die and opened to the fourth edge.

2. The LED die module of claim 1, wherein the first portion, the second portion and the third portion form an H-shaped structure.

3. The LED die module of claim 1, wherein the surface comprises a first edge, a second edge, a third edge and a fourth edge, the first edge is opposite to the second edge, and the third edge is opposite to the fourth edge, the first portion is formed on the first edge, and the second portion is formed on the second edge, both the first portion and the second portion extend from the third edge to the fourth edge.

4. The LED die module of claim 3, wherein the first opening faces the third edge, and the second opening faces the fourth edge.

5. The LED die module of claim 1, wherein the first portion is parallel to the second portion.

6. The LED die module of claim 1, wherein the third portion is perpendicular to the first portion and the second portion.

7. The LED die module of claim 1, wherein the guiding layer further comprises a plurality of fourth portions, the fourth portions are formed on the first electrically connecting area and the second electrically connecting area, and the fourth portions are formed spaced from each other and spaced from the first portion, the second portion and the third portion.

8. The LED die module of claim 7, wherein the fourth portions are stick-shaped.

9. The LED die module of claim 8, wherein the fourth portions comprise a plurality of first sticks and a plurality of second sticks, and a length of each first stick is less than or equal to that of each second stick.

10. The LED die module of claim 7, wherein the fourth portions are cylinder, and the fourth portions are arranged in a matrix.

11. The LED die module of claim 7, wherein the fourth portions comprise a plurality of stick-shaped portions and a plurality of circular portions.

12. The LED die module of claim 11, wherein the circular portions are arranged in a matrix, and the stick-shaped portions cross between the circular fourth portions.

13. The LED die module of claim 1, wherein a thickness of the guiding layer is less than or equal to 2 micrometers.

14. A light emitting diode (LED) element, comprising:
an LED die module, comprising:
an LED die having a surface with a first edge, a second edge, a third edge, and a fourth edge, the first edge being opposite to the second edge, and the third edge being opposite to the fourth edge; and
a guiding layer formed on the surface, comprising:
a first portion formed on the first edge of the surface;
a second portion formed on the second edge of the surface;
a third portion connected between the first portion and the second portion, and dividing the surface into a first electrically connecting area and a second electrically connecting area; and
a first opening positioned at the first electrically connecting area and a second opening positioned at the second electrically connecting area facing two opposite directions and defined by the first portion, the second portion and the third portion, the first opening being a gap between the first portion and the second portion, the first opening being opened to the surface of the LED die and opened to the third edge, the second opening being a gap between the first portion and the second portion, the second opening being opened to the surface of the LED die and opened to the fourth edge;
a substrate; and
a die attaching layer for forming the LED die on the substrate and electrically connecting the LED die to the substrate.

15. The LED element of claim 14, wherein a thickness of the die attaching layer is more than or equal to 5 micrometers.

16. The LED element of claim 14, wherein the guiding layer further comprises a plurality of fourth portions, the fourth portions are formed on the first electrically connecting area and the second electrically connecting area, and the fourth portions are formed spaced from each other and spaced from the first portion, the second portion and the third portion.

17. The LED die module of claim 14, wherein a thickness of the guiding layer is less than or equal to 2 micrometers.

* * * * *